United States Patent
Aharonov et al.

(10) Patent No.: US 6,274,257 B1
(45) Date of Patent: Aug. 14, 2001

(54) FORMING MEMBERS FOR SHAPING A REACTIVE METAL AND METHODS FOR THEIR FABRICATION

(75) Inventors: Robert R. Aharonov, West Bloomfield, MI (US); Sridhar Chellapilla, Columbus, OH (US); Raymond P. Fontana, Waldwick; Bernard J. Janoss, Bridgewater, both of NJ (US)

(73) Assignee: IonBond Inc., Rockaway, NJ (US)

( * ) Notice: Subject to any disclaimer, the term of this patent is extended or adjusted under 35 U.S.C. 154(b) by 0 days.

(21) Appl. No.: 09/430,146

(22) Filed: Oct. 29, 1999

(51) Int. Cl.$^7$ .................................................. B32B 9/00
(52) U.S. Cl. ..................... 428/698; 428/704; 428/627; 428/472; 428/699; 428/248.1; 428/255.3; 428/255.2; 428/255.1; 428/255; 164/138; 249/135; 249/134; 249/114.1
(58) Field of Search ..................... 428/698, 472, 428/699, 627, 704; 427/255.3, 255.2, 255.1, 255, 248.1; 164/138; 249/135, 134, 114.1

(56) References Cited

U.S. PATENT DOCUMENTS

| | | | |
|---|---|---|---|
| 4,556,098 | 12/1985 | Hintermann et al. | 164/316 |
| 4,753,854 | 6/1988 | Gavrilov et al. | 428/698 |
| 4,852,542 | 8/1989 | Kamo et al. | 123/668 |
| 5,114,470 | 5/1992 | Biancaniello et al. | 75/338 |
| 5,236,661 | 8/1993 | Hidaka et al. | 420/428 |
| 5,318,091 | 6/1994 | Pavoni et al. | 164/6 |
| 5,413,821 | 5/1995 | Ellis et al. | 427/576 |
| 5,476,134 | 12/1995 | Whittle et al. | 164/138 |
| 5,575,902 | 11/1996 | Heyse et al. | 208/48 R |
| 5,601,293 | 2/1997 | Fukutome et al. | 277/235 A |
| 5,603,072 | 2/1997 | Kouno et al. | 419/25 |
| 5,618,590 | 4/1997 | Naruse et al. | 427/528 |
| 5,690,759 | 11/1997 | Wang | 249/114.1 |
| 5,723,800 | 3/1998 | Yoshimoto et al. | 75/238 |
| 5,806,336 | 9/1998 | Sunaga et al. | 62/469 |
| 5,841,046 | 11/1998 | Rhodes et al. | 75/246 |
| 5,851,680 | * 12/1998 | Heau . | |

OTHER PUBLICATIONS

Robert R. Aharonov, Bernard J. Janoss and Mark A. Pellman "How chromium nitride performs on metal forming dies–striving for abrasive, adhesive protection for tooling" article reprinted from the Jun. 1995 issue of The Fabricator.

* cited by examiner

Primary Examiner—Deborah Jones
Assistant Examiner—Wendy Boss
(74) Attorney, Agent, or Firm—Gifford, Krass, Groh, Sprinkle, Anderson & Citkowski, P.C.

(57) ABSTRACT

Coatings of doped chromium nitride protect forming members such as dies from the corrosive effects of molten aluminum and other reactive metals.

26 Claims, 1 Drawing Sheet

FORMING MEMBERS FOR SHAPING A REACTIVE METAL AND METHODS FOR THEIR FABRICATION

FIELD OF THE INVENTION

This invention relates generally to forming members such as molds, dies and the like for shaping aluminum and other reactive metals. More particularly, the invention relates to forming members having a coating thereupon of doped chromium nitride and to methods for their fabrication and use.

BACKGROUND OF THE INVENTION

Molds, dies, cores, pins and other such forming members for shaping molten metals are frequently manufactured from steel because of its low cost and ease of fabrication. Problems arise when such forming members are used to shape reactive metals, such as aluminum, magnesium and zinc containing alloys. It has been found that such alloys, particularly low iron content aluminum alloys, are reactive in the molten state and can corrode and/or erode the surface of molds, dies and other forming members significantly reducing their surface life.

A number of approaches have been taken in an attempt to solve this problem. One approach involves nitriding the surface of the forming member. Nitrided surfaces do provide some protection from attack by certain alloys; but this protection is fairly limited, and nitrided surfaces are ineffective against more reactive metals, such as aluminum alloys, particularly those aluminum alloys having an iron content of 1.2% or less, and aluminum alloys with a silicon content of up to 18%. Another approach involves implanting tungsten into the surface of steel forming members. Generally, such implantation processes are fairly expensive; furthermore, protection provided thereby is still somewhat limited.

A further approach, which is disclosed in U.S. Pat. 5,476,134, comprises coating a surface of the forming member with a layer of chromium nitride. As disclosed therein, the chromium nitride coating has good resistance to attack by reactive metal alloys, including low iron content aluminum alloys. While such prior art chromium nitride coatings provide good erosion resistance, it has been found that these coatings tend to fail, particularly in the region of sharp features on the forming member such as edges, textured surfaces and the like. While not wishing to be bound by speculation, the inventors herein theorize that stresses in such prior art coatings concentrate at sharp edges and provide cracks and fissures which allow molten metal to contact underlying substrate material and cause erosion.

The foregoing makes clear that there is a need for a surface treatment which can be applied to forming members such as molds and dies, which will protect such members from attack by reactive metals. The treatment should be easy to apply, low in cost, and should not interfere with use of the forming members. In addition, the treatment should be durable and provide long service life. The present invention, as will be described in detail hereinbelow, utilizes a doped coating of chromium nitride as a protective treatment for forming members. While chromium nitride coatings have previously been used in molds for shaping aluminum, doped coatings have not; and it has been found, unexpectedly, that the addition of relatively small amounts of dopant greatly enhance the resistance of chromium nitride coatings to attack by molten metal. These and other advantages of the present invention will be apparent from the drawings, discussion and description which follow.

BRIEF DESCRIPTION OF THE INVENTION

There is disclosed herein a forming member for shaping a reactive metal. The forming member comprises a substrate having a forming surface defined thereupon, and a protective coating on at least a portion of the forming surface. The protective coating comprises doped chromium nitride. In specific embodiments, the chromium nitride is in the form of a polycrystalline CrN matrix having a dopant dispersed therein, and the CrN crystals have a slightly preferred bias in the 220 orientation. Preferred dopant ranges comprise 1–10 atomic percent, and some specifically preferred dopants comprise transition metals, such as tungsten or molybdenum, as well as oxygen. Coating thicknesses are typically in the range of 2–40 microns.

Also disclosed herein is a method for forming the protective coating, which method comprises depositing the coating by a physical vapor deposition process. In some specific embodiments of the process, the physical vapor deposition process is a cathodic arc process. In some versions of the cathodic arc process, the dopant is a metal, and is incorporated into a chromium cathode, and the deposition process is carried out in a working atmosphere of nitrogen so as to deposit the doped chromium nitride coating. In other versions of the cathodic process, the dopant is oxygen, and the cathode consists essentially of chromium. The working atmosphere in such instance comprises nitrogen and oxygen, and operates to deposit an oxide doped chromium nitride coating. Also disclosed herein are methods for using the coated forming members in a metal forming process.

DETAILED DESCRIPTION OF THE INVENTION

Figure 1:
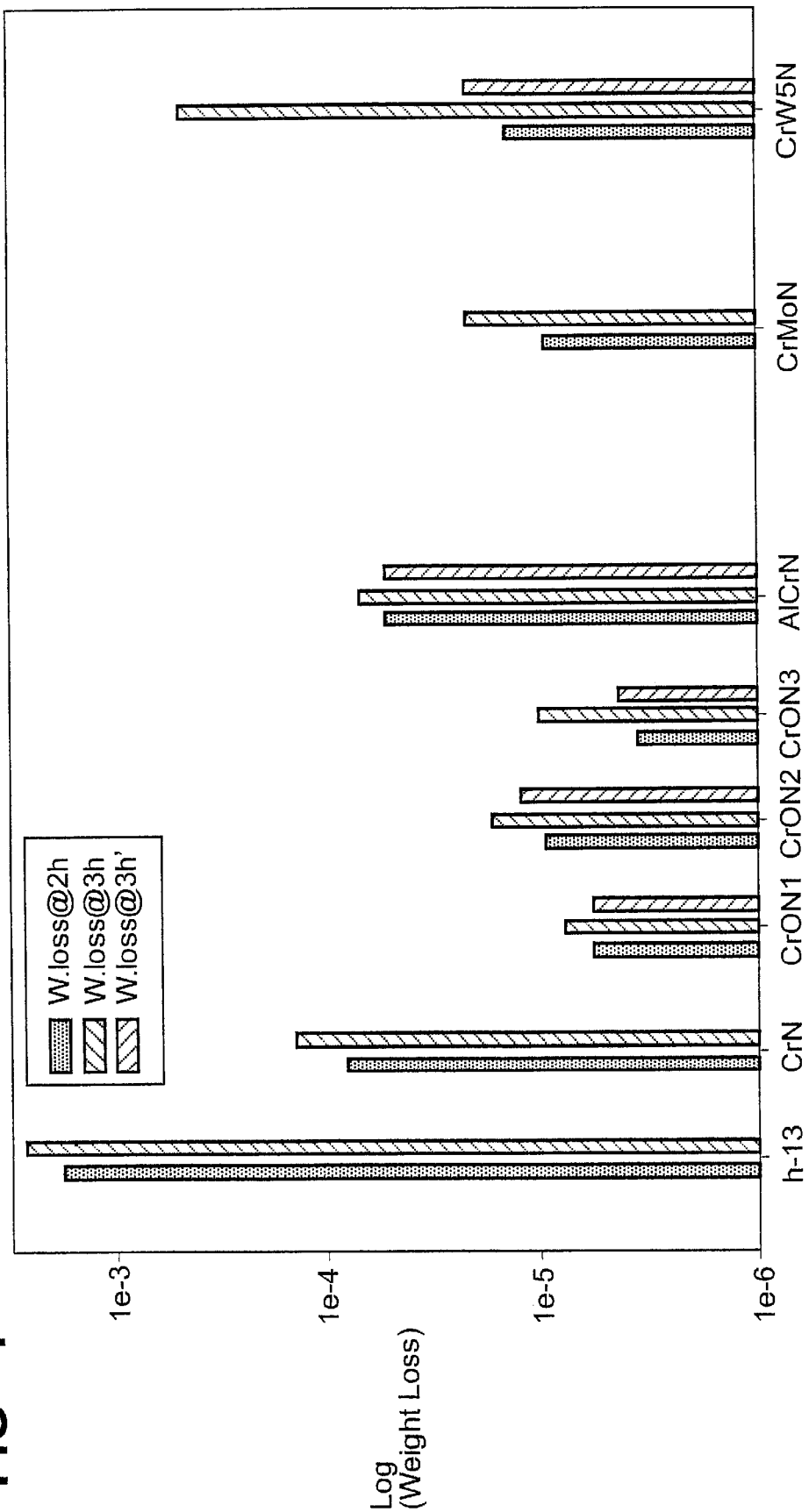
FIG. 1 is a graph illustrating the effect of the coatings of the present invention in preventing corrosion of steel by molten aluminum.

In accord with the present invention, it has been found that doped chromium nitride provides a protective coating which can be applied to molds and other such metal forming materials, and which is highly resistant to attack by molten reactive metals such as low iron content aluminum alloys. The doped coatings of the present invention provide metal forming members with superior resistance to corrosion and/or erosion by molten metals, as compared to prior art coatings.

The materials of the present invention differ physically, and in performance characteristics, from prior art undoped chromium nitride coatings. While not wishing to be bound by speculation, the inventors hereof postulate that the presence of the dopant material minimizes compressive stress in chromium nitride films thereby making them less prone to cracking, particularly in the regions of edges or sharp features. In addition, the dopant is believed to reduce the porosity of the films and to stop propagation of cracks therethrough. X-ray diffraction analysis indicates that the coatings of the present invention are primarily in the form of a matrix of polycrystalline CrN having the dopant material dispersed therethrough. X-ray diffraction further indicates that the presence of the dopant produces a finer grain structure in the polycrystalline matrix as compared to the undoped material. This finer matrix provides for tighter packing and produces a coating which is dense and nonporous, and hence less likely to be penetrated by molten metal. The dopant also appears to influence the crystal orientation of the material. Undoped polycrystalline chromium nitride is found to have a preferred bias to the 220 orientation, while doped chromium nitride films of the present invention have a more random orientation, with only a slightly preferred bias (i.e. less than 10%) to the 220 orientation. This change in structure is also postulated to increase the strength and corrosion resistance of the films.

There is no upper limit on the amount of dopant which may be employed in the present invention; and in some instances, dopant levels of up to 50 atomic percent may be employed. In some preferred embodiments, the dopant is present in an amount of 1–10 atomic percent of the material, and in some specifically preferred embodiments, the dopant comprises 2–5 atomic percent of the material. Preferred dopant materials include transition metals and oxygen taken either singly or in combination. Some specifically preferred transition metals comprise tungsten and molybdenum. The thickness of the coating used will depend upon particular applications; however, in most instances, it has been found that coating in the thickness range of 2–10 microns will provide a steel substrate with very good resistance to attack by molten reactive metals. Furthermore, coatings of such thickness exhibit very long service life. However, coatings of 20–30 microns will be practical and desirable for some applications, while still greater thicknesses may be implemented in accord with the present invention.

The coatings of the present invention are preferably deposited by a vapor deposition process. A particularly preferred group of deposition processes comprise physical vapor deposition processes, with cathodic arc physical vapor deposition comprising one specifically preferred group of deposition processes. Such processes are known in the art and have been widely used for depositing hard, thin film coatings onto a variety of substrates. Cathodic arc processes employ an arc to vaporize and ionize metal from one or more solid cathode sources. The ionized metal vapor is attracted to the substrate work pieces which are maintained at a negative bias. Advantages of the process are high deposition rates together with relatively low substrate temperatures. The process is typically carried out at relatively low pressures, and in some instances, an atmosphere which includes a reactive working gas is present in the deposition chamber. The working gas reacts with the metallic species to produce the coating material. One such process, as adapted for deposition of undoped chromium nitride, is disclosed on pages 833, and following, of the June, 1995 issue of a publication entitled *The Fabricator* published by the Fabricators and Manufacturers Association International; 833 Featherstone Road, Rockford, Ill. 61107-6302; the disclosure of which is incorporated herein by reference.

In accord with the present invention, the dopant material can be incorporated directly into a cathode. For example, a cathode may be made of a mixture of chromium and a dopant; or a system may include a plurality of cathodes, some of which are comprised of the dopant, and others of which are comprised of undoped. chromium. Alternatively, the dopant may be present in the working gas. In those instances where the dopant comprises a metal such as tungsten or molybdenum, the dopant is most preferably incorporated directly into the chromium cathode material. The reactive gas comprises nitrogen, and the process deposits metal-doped chromium nitride. In those instances where the dopant comprises oxygen, the cathode is most preferably pure chromium, and the working gas includes nitrogen and oxygen, most preferably in a ratio of 2:1. Pressure of the working gas is typically in the range of 20–25 millitorr, and the work piece is biased by voltage in the range of approximately 50–75 volts. However, other parameters may also be advantageously employed depending on the specifics of the deposition apparatus and process. While a physical vapor deposition process is described wherein the chromium and dopant are simultaneously deposited, deposition may also be sequential. For example, chromium may first be deposited in a thin layer then the dopant (either metal or oxygen) deposited thereatop. This process may be repeated for a number of cycles so as to build up a body of doped material. Also, it is to be understood that other processes for the deposition of the coating such as sputtering and the like may also be employed.

A series of experiments were carried out to evaluate the materials of the present invention. In this experimental series, a number of sample coatings were prepared and evaluated. The coatings comprised doped chromium nitride materials as well as comparative materials of the prior art. The coatings were applied onto cylindrical steel pins by a cathodic arc deposition process of the type described hereinabove. The coated pins were immersed into molten aluminum for time periods ranging from one to three hours. The pins were rotated while immersed. The pins were removed from the molten aluminum, allowed to cool, and any adherent aluminum removed by etching in a caustic solution. The weight loss per unit area (exposed) of the pins was then measured to assess the protective effect of the various coatings. These experimental conditions provide a good simulation of conditions encountered in casting operations. Process parameters employed for the preparation of the coatings were varied in order to optimize coating conditions. The most preferred coatings were then evaluated in an actual casting operation.

Experimental Results

The first group of coatings which were evaluated comprised chromium nitride doped with tungsten. Samples were prepared by a cathodic arc plasma deposition process utilizing cathodes having 5 and 10 atomic percent of tungsten in chromium. The depositions were carried out utilizing a bias voltage ranging from 50 to 250 volts and a nitrogen pressure in the chamber ranging from 5 to 25 millitorr. The samples were then evaluated as described above. Based upon the foregoing, it was determined that the best materials were prepared utilizing a cathode comprising 5 atomic percent tungsten in chromium. The optimum range for bias voltage was 50–75 volts and the optimum range for nitrogen pressure was 20–25 millitorr. The following conditions produced coatings comprised of a CrN matrix having approximately 2–4 atomic percent of tungsten dispersed therein. X-ray analysis showed the material to be mostly random in its orientation, with only a slight bias to the 220 orientation. In a coating deposited onto a flat coupon, the thickness was measured, by the ball-crater method, as being approximately 5.5 microns. This particular coated sample had a surface roughness Ra of 1009±184, Å (2 mm scan); a microhardness $Hv_{5gr}$ of 3599±63 and a modulus of elasticity of 342±6 Gpa. A second sample was coated onto a cylindrical pin. This coating had a measured thickness, by ball-crater method, of 5.8 microns at the flat tip of the pin and 6.2 microns as measured one inch from the tip. Surface roughness of this material was measured at 964±183 at the point one inch from the tip. The microhardness of the material as measured at the tip was 3237±63 $Hv_{5gr}$; and the modulus of elasticity at the flat tip was 335±6 $GP_a$.

Process parameters for the preparation of oxygen doped chromium nitride films were also evaluated. In this experimental series, bias voltage was also varied from 50 to 250 volts and pressure of the working gas from 5 to 25 millitorr. The O/N ratio varied from 0.125 to 0.5. Samples were evaluated as described above, and it was determined that the optimum range of bias voltage for a preparation of coatings of this type is 50–75 volts, the optimum pressure for the working gas 20–25 millitorr, and the optimum ratio of oxygen to nitrogen is 1:2. As for the preceding series of materials, coatings were deposited onto steel coupons as well as cylindrical pins. The thickness of the coupon coating as measured by the ball-crater method was 5.2 microns. The surface roughness, Ra of the thus prepared material (2 mm scan) was measured at 756±171 Å. The microhardness of this particular coatings was 2940±58 $Hv_5$ gr, and its modulus of elasticity 308±6 GPa. In the coated pin, the thickness at the flat tip of the pin was measured at 5.2 microns, and the thickness 1 inch from the tip at 5.0 microns. Surface roughness was measured at 1 inch from the tip and was 1256±72 Å (2 mm scan). Microhardness as measured at the flat tip of the pin was 2849±45 $Hv_5$ gr, and the modulus of elasticity as measured at the flat tip of the pin was 313±5 GPa.

Referring now to FIG. 1, there is shown a graph depicting the test results for a series of materials both in accord with the present invention, and illustrative of prior art. Specifically, FIG. 1 shows the log of weight loss plotted for a series of different materials after 2 and 3 hours of immersion in molten aluminum. The tests were carried out using molten aluminum alloy A380. This alloy is employed in approximately 90% of commercial casting operations. The aluminum was maintained at a temperature of 760° C. Pins were coated with various of the materials to a thickness of approximately 4–6 microns. Each pin was rotated in the molten aluminum at approximately 100 rpm, which at the diameter of the particular pins employed resulted in a relative linear motion of 2.5 inches per second for the coated surface in relation to the molten aluminum. Each pin was maintained in the molten aluminum for 1 or 3 hours, after which residual aluminum was etched away in a caustic bath, and weight loss of the pins determined. As will be seen from FIG. 1, some of the three hour tests were run in duplicate.

Referring now to FIG. 1, first entry labeled H-13 represents an uncoated steel pin. As will be seen, weight loss is very high. The second sample labeled CrN comprises a chromium nitride coating of the type employed in the prior art. This coating does provide some protection from erosion. The next three coatings are labeled CrON-1, CrON-2 and CrON-3 respectively. These coatings all comprise oxygen doped chromium nitride materials of the present invention. As will be seen, the materials provide superior resistance to corrosion and erosion. The next coating is labeled AlCrN and comprises an aluminum doped chromium nitride coating of the present invention. Again, it will be noted that good erosion protection is provided. The next coating is labeled CrMoN and this material comprises a molybdenum doped chromium nitride in accord with the present invention. This material also provides very good erosion protection. The final coating is labeled CrW5N and comprises a tungsten doped coating in accord with the present invention. Again, this material provides very good corrosion protection. From the data of FIG. 1, it will be seen that the doped chromium nitride materials of the present invention are very effective in preventing erosion of steel by molten aluminum, as compared to prior art coatings.

Various materials of the present invention were evaluated in actual production conditions. In one experimental series, aluminum die casting molds were coated with tungsten doped materials of the present invention, and results compared with tooling coated with prior art coatings of undoped chromium nitride, CTC and VC. The CrN coating provided 25,000 casting cycles before failure. The CrC coating produced approximately 17,000 cycles before failure. The coatings of the present invention were evaluated after 42,000 casting cycles (or shots) and found to be in very good condition. Based upon visual observation, operators of the casting operation predicted an approximately 50–75,000 cycles of casting could be carried out before failure of the coating. In another evaluation, performance of the tungsten doped coatings of the present invention were compared with nitrided mold coatings. The nitrided coatings failed after approximately 16,000 molding cycles, while the materials of the present invention continued to perform well even after 20,700 molding cycles.

The coatings of the present invention were also subjected to thermal cycling in order to assess if catastrophic failure would result. These coatings were heated to a temperature of approximately 750° C. in molten aluminum, and then quenched in water. The coatings were inspected after 3,000 of said cycles, and no soldering of aluminum to the underlying steel was noted, nor was any initiating of hairline cracks noted, both of which were present in prior art CrN coatings.

As is demonstrated by the foregoing, the present invention provides a novel protective coating of doped chromium nitride. This coating is fundamentally different from prior art undoped chromium nitride coatings as is made clear by analytical data as well as performance evaluations. While the materials of the present invention have been primarily described with reference to a cathodic arc physical vapor deposition process, the materials may be prepared by other techniques known in the art such as sputtering, electron beam evaporation, ion implantation, MBE and the like. The foregoing examples primarily describe the use of oxygen, molybdenum and tungsten dopants; however, it is to be understood that other dopants may also be employed with advantage. Also, it is to be understood that the coatings of the present invention may be configured as multi-layered structures. For example, different compositions of doped chromium nitrides may be layered to produce a heterogeneous body comprised of doped chromium nitride; alternatively, doped chromium nitride of the present invention may be layered with other materials to produce a composite structure.

The foregoing drawings, discussion and description are illustrative of particular embodiments of the present invention; but, are not meant to be limitations upon the practice thereof. It is the following claims, including all equivalents, which define the scope of the invention.

What is claimed is:

1. A forming member for shaping a reactive metal, said forming member comprising:

a substrate having a forming surface defined thereupon; and a protective coating disposed on at least a portion of said forming surface, said protective coating comprising a doped chromium nitride.

2. The forming member of claim 1, wherein said doped chromium nitride comprises a matrix of CrN having a dopant material therein.

3. The forming member of claim 2, wherein said CrN comprises a random polycrystalline body in which the crystals thereof have a slight bias to the 220 crystal orientation.

4. The forming member as in claim 1, wherein the dopant comprises 1–10 atomic percent of said doped chromium nitride.

5. The forming member of claim 1, wherein said chromium nitride is doped with a material selected from the group consisting of transition metals, oxygen, and combinations thereof.

6. The forming member of claim 1, wherein said chromium nitride is doped with a material selected from the group consisting of tungsten, molybdenum, oxygen, and combinations thereof.

7. The forming member as in claim 1, wherein the thickness of said protective coating is in the range of 1–20 microns.

8. A forming member as in claim 1, wherein said substrate is comprised of steel.

9. A forming member as in claim 1, wherein said forming member comprises a die casting mold.

10. A method for forming a reactive metal, said method comprising:
    providing a forming member, said forming member comprising a substrate having a forming surface defined thereupon, and a protective coating of a doped chromium nitride disposed upon at least a portion of said forming surface; and
    maintaining a reactive metal in contact with said forming surface for a period of time sufficient to form said reactive metal.

11. A method as in claim 10, wherein said reactive metal comprises aluminum or zinc or magnesium.

12. A method as in claims 10, wherein said forming member is a die casting die.

13. A method as in claim 10, wherein said protective coating comprises CrN doped with a material selected from the group consisting of: tungsten, molybdenum, oxygen, and combinations thereof.

14. A protective coating which is resistant to molten, reactive metals, said coating consisting essentially of:
    a matrix of CrN; and
    a dopant dispersed in said matrix, said dopant selected from the group consisting of: transition metals, oxygen, and combinations thereof.

15. A coating as in claim 14, further characterized in that said coating is polycrystalline, and the crystals thereof are randomly oriented, with only a slight bias to a 220 crystal orientation.

16. A protective coating as in claim 14, wherein said dopant is selected from the group consisting of: tungsten, molybdenum, oxygen, and combinations thereof.

17. A protective coating as in claim 14, wherein said dopant comprises 1–10 atomic percent of said matrix.

18. A protective coating as in claim 14, having a thickness in the range of 1–20 microns.

19. A method for forming a protective coating on a forming member used for shaping a reactive metal, said method comprising:
    depositing a coating of doped chromium nitride onto at least a portion of said forming member by a physical vapor deposition process.

20. The method of claim 19, wherein said physical vapor deposition process is a cathodic arc physical vapor deposition process.

21. The method of claim 19, wherein the chromium nitride is doped with a metal, and wherein said physical vapor deposition process is carried out using a source comprising chromium and said dopant metal, and wherein a working atmosphere employed in said cathodic arc physical vapor deposition process comprises nitrogen.

22. The method of claim 21, wherein said metal comprises a transition metal.

23. The method of claim 21, wherein said physical vapor deposition process is a cathodic arc physical vapor deposition process.

24. The method of claim 23, wherein said dopant metal comprises tungsten and wherein said cathodic arc physical vapor deposition process is carried out in a bias of 50–75 volts, and wherein the pressure of said working atmosphere is in the range of 20–25 millitorr.

25. The method of claim 23, wherein said chromium nitride is doped with oxygen and wherein said cathodic arc physical vapor deposition process employs a cathode consisting essentially of chromium and a working atmosphere comprising nitrogen and oxygen.

26. The method of claim 25, wherein said cathodic arc physical vapor deposition process is carried out at a bias in the range of 50–75 volts, and wherein said working gas comprises, on a molar basis, 2 parts nitrogen and 1 part oxygen, and wherein the pressure of said working gas is in the range of 20–25 millitorr.

* * * * *